US012676579B1

(12) United States Patent
Raimar et al.

(10) Patent No.: US 12,676,579 B1
(45) Date of Patent: Jul. 7, 2026

(54) CRYSTAL OSCILLATORS INCLUDING A TWO STAGE AMPLIFIER

(71) Applicant: Cypress Semiconductor Corporation, San Jose, CA (US)

(72) Inventors: Nandakishore Raimar, Bangalore (IN); Blessy Mathew, Ernakulam (IN)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 19/059,235

(22) Filed: Feb. 20, 2025

(51) Int. Cl.
*H03B 5/36* (2006.01)
*H03F 3/26* (2006.01)

(52) U.S. Cl.
CPC ............. *H03B 5/364* (2013.01); *H03F 3/265* (2013.01)

(58) Field of Classification Search
CPC .. H03B 5/36; H03B 5/364; H03B 5/32; H03F 3/265
See application file for complete search history.

(56) References Cited

U.S. PATENT DOCUMENTS

| | | | | |
|---|---|---|---|---|
| 4,091,338 A | * | 5/1978 | Morihisa | G04F 5/06 331/108 D |
| 11,171,604 B1 | * | 11/2021 | Branch | H03B 5/326 |
| 2006/0181361 A1 | * | 8/2006 | Van De Gevel | H03B 5/32 331/158 |
| 2007/0063768 A1 | * | 3/2007 | Kamiya | H03F 11/00 330/136 |
| 2017/0279423 A1 | * | 9/2017 | Ko | H03F 1/3205 |

FOREIGN PATENT DOCUMENTS

WO WO-2010105932 A1 * 9/2010 ............... H03B 5/32

* cited by examiner

*Primary Examiner* — Ryan Johnson

(57) ABSTRACT

A crystal oscillator includes a two stage amplifier and a crystal. The two stage amplifier includes a transconductance amplifier stage electrically connected to a class AB output amplifier stage with open loop drive level control. The two stage amplifier provides a negative resistance. The crystal is electrically connected between an input of the two stage amplifier and an output of the two stage amplifier.

20 Claims, 8 Drawing Sheets

CRYSTAL OSCILLATORS INCLUDING A TWO STAGE AMPLIFIER

BACKGROUND

Crystal oscillators are used in electronic devices, including wireless devices, to generate a stable and precise frequency signal, such as a clock signal. Crystal oscillators utilize the mechanical vibrations of a quartz crystal, which oscillates at a specific frequency when an electric current is applied, providing a highly accurate reference signal. In wireless devices, crystal oscillators are used to control the timing of operations, such as frequency modulation and demodulation, ensuring that signals are transmitted and received accurately. A stable clock signal is used to maintain the integrity of communication, synchronization, and efficient operation in systems like radios, mobile phones, and Wi-Fi devices. In wireless devices, the power consumption of the crystal oscillator is a significant portion of the overall power consumption of the wireless device, particularly when the wireless device is in a sleep mode. For example, in some wireless devices, the crystal oscillator may constitute up to about 20 percent of the typical overall sleep power consumption.

For these and other reasons, a need exists for the present invention.

SUMMARY

Some examples of the present disclosure relate to a crystal oscillator. The crystal oscillator includes a two stage amplifier and a crystal. The two stage amplifier includes a transconductance amplifier stage electrically connected to a class AB output amplifier stage with open loop drive level control. The two stage amplifier provides a negative resistance. The crystal is electrically connected between an input of the two stage amplifier and an output of the two stage amplifier.

Other examples of the present disclosure relate to a device. The device includes a crystal oscillator to generate a clock signal and a circuit electrically connected to the crystal oscillator and configured to operate based on the clock signal. The crystal oscillator includes a two stage amplifier and a crystal. The two stage amplifier includes a transconductance amplifier stage electrically connected to a class AB output amplifier stage with open loop drive level control. The two stage amplifier provides a negative resistance. The crystal is electrically connected between an input of the two stage amplifier and an output of the two stage amplifier.

Yet other examples of the present disclosure relate to a method for generating a clock signal. The method includes amplifying an input signal on a first terminal of a crystal via a two stage amplifier to provide an output signal on a second terminal of the crystal. The two stage amplifier includes a transconductance amplifier stage and a class AB output amplifier stage with open loop drive level control. The two stage amplifier provides a negative resistance. The method includes generating a clock signal based on the output signal.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Power consumed by a wireless microcontroller (MCU) of a wireless device during a sleep mode is a specification that predominantly defines the battery life of the wireless device. During a sleep mode, a crystal oscillator may be used to count time accurately. The crystal oscillator may constitute up to about 20 percent of the typical overall sleep power of the MCU. Accordingly, there is a desire to reduce the power consumption of major sleep power contributors, which includes the operating power consumption of the crystal oscillator. Therefore, disclosed herein are crystal oscillators with reduced operating power consumption. In some examples, the crystal oscillators disclosed herein might reduce power consumption by up to 66 percent compared to typical crystal oscillators.

Figure 1:
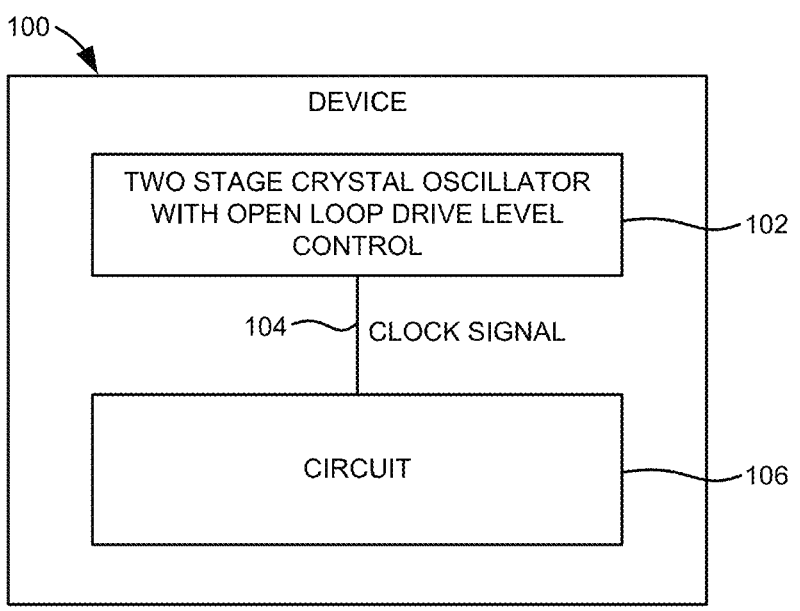
FIG. 1 is a block diagram illustrating an exemplary device including a crystal oscillator.

FIG. 1 is a block diagram illustrating an exemplary device 100. Device 100 includes a two stage crystal oscillator with open loop drive level control 102 and a circuit 106. The crystal oscillator 102 is electrically connected to the circuit 106 through a clock signal path 104. The crystal oscillator 102 generates a clock signal as described below with reference to the following FIGS. 3A-7B. The circuit 106 is configured to operate based on the clock signal. Circuit 106 may include a MCU, a memory, a Bluetooth transceiver, a Wi-Fi transceiver, or another suitable circuit. In some examples, device 100 may be a wireless device, such as a smart watch, a mobile phone, a tablet, an internet of things (IoT) device, etc. One example of a wireless device 100 is further described below with reference to FIG. 8.

Figure 2:
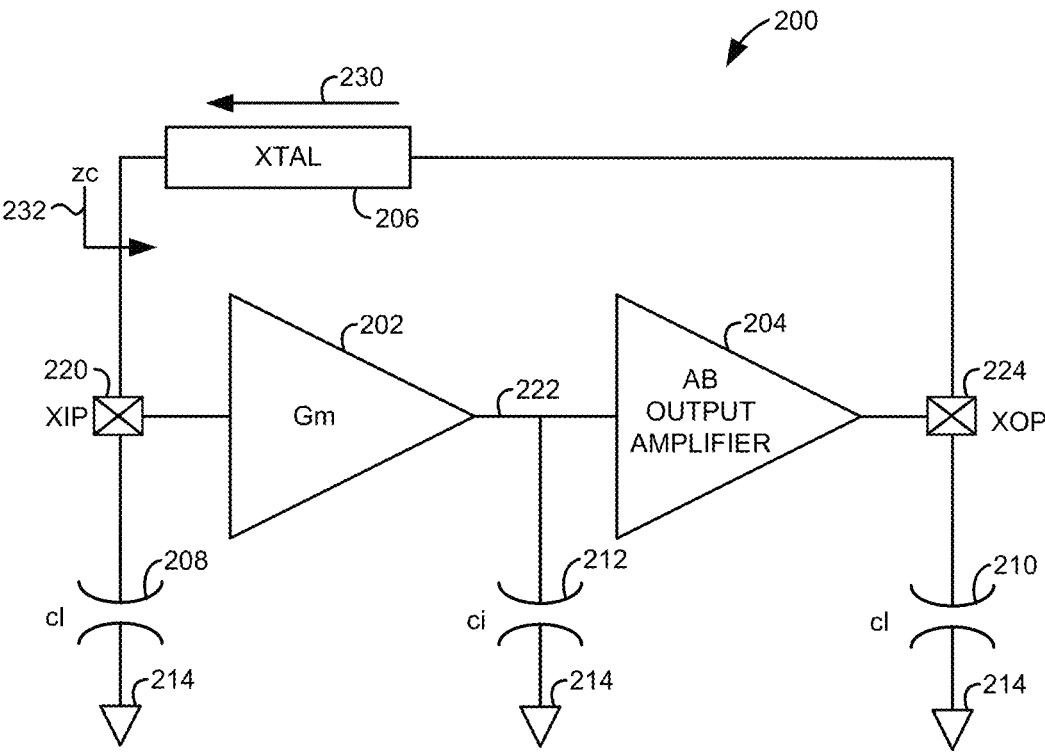
FIG. 2 is a schematic diagram illustrating an exemplary crystal oscillator including a two stage amplifier.

FIG. 2 is a schematic diagram illustrating an exemplary crystal oscillator 200 including a two stage amplifier, such as crystal oscillator 102 of device 100 of FIG. 1. Crystal oscillator 200 includes a transconductance amplifier stage 202 (e.g., a first amplifier stage), a class AB output amplifier stage 204 (e.g., a second amplifier stage), capacitors 208, 210, and 212, and a crystal 206. Capacitors 208 and 210 are load capacitances (cl) of the crystal 206 and capacitor 212 is an internal capacitance (ci). In some examples, the capacitors 208 and 210 may be within a range between about 4 picofarads and about 12 picofarads, usually defined by the crystal, and the capacitor 212 may be less than about 100 femtofarads.

Crystal 206 is electrically connected between a crystal input pin (XIP) node 220 and a crystal output pin (XOP) node 224. XIP node 220 is electrically connected to one side of capacitor 208 and the input of transconductance amplifier stage 202. The output of transconductance amplifier stage 202 is electrically connected to one side of capacitor 212 and the input of AB output amplifier stage 204 through a signal path 222. XOP node 224 is electrically connected to the output of AB output amplifier stage 204 and one side of capacitor 210. The other side of capacitor 208, the other side of capacitor 210, and the other side of capacitor 212 are electrically connected to a common or ground node 214.

In some examples, AB output amplifier stage 204 might have a voltage gain of less than or equal to 1, such that AB output amplifier stage 204 is a unity gain amplifier or buffer. The output of AB output amplifier stage 204 might have a very low output impedance, such that the effect of impedance due to capacitor 210 may be relatively very small. This low impedance output enables the two stage amplifier to provide a high negative resistance as described below. With AB output amplifier stage 204 having a gain of 1, AB output amplifier stage 204 contributes to the negative resistance by isolating capacitor 210. In other examples, AB output amplifier stage 204 might have a gain greater than 1. With AB output amplifier stage 204 having a gain greater than 1, AB output amplifier stage 204 contributes to the negative resistance provided by the two stage amplifier. The equations for negative resistance disclosed below assume AB output amplifier stage 204 has a gain of 1. It will be apparent that the equations would need to be modified for examples where AB output amplifier stage 204 has a gain greater than 1.

The two stage amplifier (e.g., due to transconductance amplifier stage 202) provides a negative resistance (zc) as indicated at 232. Negative resistance is used in crystal oscillator 200 to sustain oscillations by compensating for the losses inherent in the crystal 206. Transconductance amplifier 202 provides a negative resistance component to provide gain that counteracts the natural energy dissipation of the crystal 206. The crystal 206 itself acts as a frequency-determining element, with its resonant frequency setting the oscillation frequency. The negative resistance generates an opposing impedance that effectively amplifies the signal, allowing continuous oscillation.

The impedance between XIP and XOP (zc) is given by:

$$zc = zl + Gmzlzi\frac{zl}{(Gmo + zl)}$$

where: zl is the load impedance of crystal 206;
  Gm is the transconductance of transconductance amplifier stage 202; and
  zi is the internal load impedance (e.g., due to capacitor 212).

Thus, the real part of the impedance, i.e., negative resistance Real (zc), can be given by:

$$zc = -\frac{Gm}{\omega^2 clci\left(\frac{\omega^2 clci}{Gmo^2} + 1\right)}$$

4 where: $\omega$ is the oscillation frequency;
  cl is the load capacitance; and
  ci is the internal capacitance.

Therefore, the two stage amplifier has a negative resistance inversely proportional to the load capacitance times the internal capacitance, thereby providing a larger negative resistance with a lower current compared to crystal oscillators including a single stage amplifier (which typically have a negative resistance inversely proportional to the square of the load capacitance).

Figure 3A:
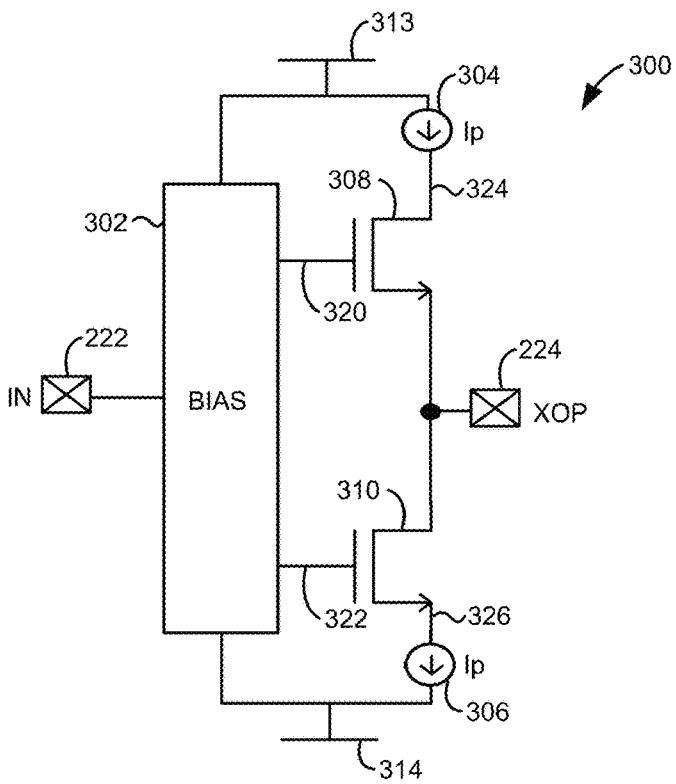
FIG. 3A is a schematic diagram illustrating an exemplary AB output amplifier stage for a crystal oscillator.

FIG. 3A is a schematic diagram illustrating an exemplary AB output amplifier stage 300 for a crystal oscillator, such as crystal oscillator 200 of FIG. 2. In some examples, AB output amplifier stage 300 may provide AB output amplifier stage 204 of FIG. 2. AB output amplifier stage 300 includes a push-pull class AB output amplifier stage with open loop drive level control. AB output amplifier stage 300 includes a bias circuit 302, current sources 304 and 306, and transistors 308 and 310 (e.g., field-effect transistors). An input (IN) node 222 is electrically connected to an input of bias circuit 302. A first output of bias circuit 302 is electrically connected to the gate of transistor 308 through a signal path 320. A second output of bias circuit 302 is electrically connected to the gate of transistor 310 through a signal path 322. A power supply node 313 is electrically connected to the bias circuit 302 and one side of current source 304. The other side of current source 304 is electrically connected to one side of the source-drain path (e.g., drain) of transistor 308 through a signal path 324. The other side of the source-drain path (e.g., source) of transistor 308 is electrically connected to one side of the source-drain path (e.g., drain) of transistor 310 through the XOP node 224. The other side of the source-drain path (e.g., source) of transistor 310 is electrically connected to one side of current source 306 through a signal path 326. The other side of current source 306 and bias circuit 302 are electrically connected to a common or ground node 314.

Figure 3B:
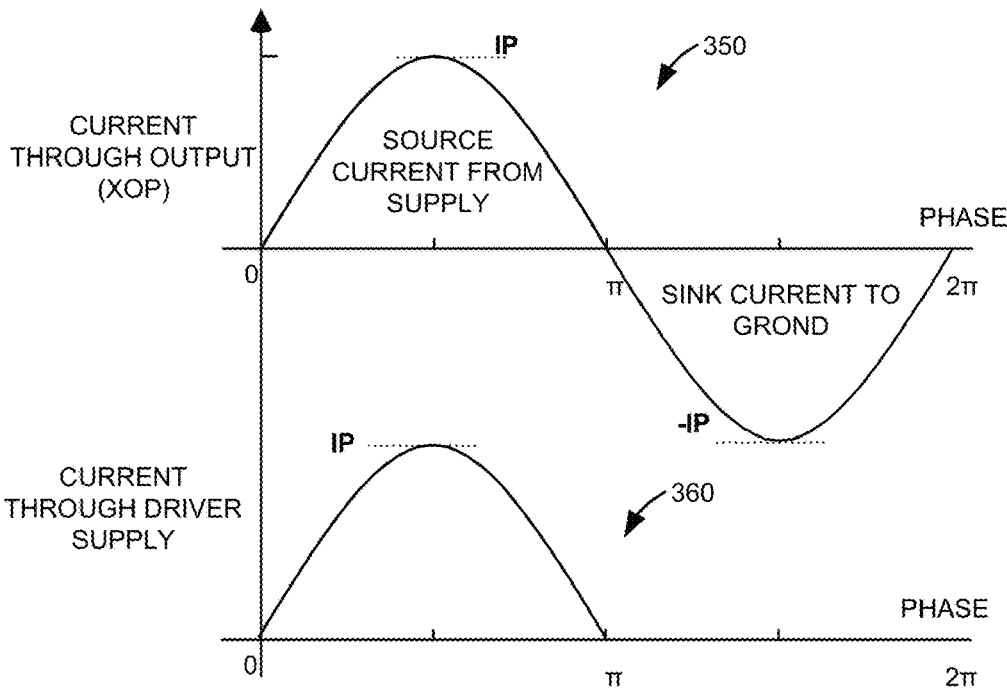
FIG. 3B illustrates exemplary signals for the AB output amplifier stage of FIG. 3A.

FIG. 3B illustrates exemplary signals for AB output amplifier stage 300 of FIG. 3A. Signal 350 illustrates the current through the output XOP node 224 of FIG. 3A. Signal 360 illustrates the current through the driver supply, such as through power supply node 313 of FIG. 3A. Referring back to FIG. 3A, AB output amplifier stage 300 receives an input signal on IN node 222 (e.g., output from transconductance amplifier stage 202 of FIG. 2) to provide an output signal on XOP node 224. As previously described, AB output amplifier stage 300 has a low output impedance. As illustrated by signal 350 of FIG. 3B, bias circuit 302 biases the transistors 308 and 310 to source current from the power supply node 313 through transistor 308 to XOP node 224 during positive portions of the output signal and sink current to common or ground node 314 through transistor 310 from XOP node 224 during negative portions of the output signal. Thus, as illustrated by signal 360 of FIG. 3B, current is only drawn from the power supply node 313 during the positive portions of the output signal.

Accordingly, the average current from the power supply node 313 is given by:

$$\text{Average Current from Supply} = Ip\frac{1}{2\pi}\int_0^\Pi \sin\theta d\theta = \frac{Ip}{\pi}$$

where: Ip is the peak current of each current source 304 and 306; and
  $\theta$ is the angle of the output signal.

AB output amplifier stage 300 may be configured to provide the minimum output current needed to maintain oscillations of the crystal (e.g., 206 of FIG. 2). For the open loop drive level control, the drive level of AB output amplifier stage 300 is given by the power dissipated (e.g., $I^2R$) by the crystal to maintain oscillations:

Drive Level=$R_{esr\_ef}[cl\omega Vo_{rms}]^2$ where: $R_{esr\_ef}$ is the electrical series resistance of the crystal;
cl is the load capacitance of the crystal;
$\omega$ is the oscillation frequency; and
Vo is the amplitude of the oscillation signal of the crystal.

Since [cl $\omega$ Vo$_{rms}$] is the drive current rms (I drive_rms):

$$(I \text{ drive\_rms})^2 = \left(\frac{Ip}{\sqrt{2}}\right)^2$$

Therefore, the drive level of the crystal may be given by:

$$\text{Drive Level} = R_{esr\_ef}\left(\frac{Ip}{\sqrt{2}}\right)^2$$

Accordingly, by controlling the peak current (Ip), the drive current rms can be controlled. This control of the drive current rms may be implemented by current sources 304 and 306, which clamp the current to limit the current pushed to the crystal. Controlling the current pushed into the crystal controls the oscillation amplitude. Therefore, the oscillation amplitude is a function of Ip.

To summarize, the output drive level of the crystal oscillator is proportional to the rms output current crystal drive point. If sufficient negative resistance is generated, the oscillation amplitude of the crystal oscillator is limited by the output rms drive current at the crystal drive point to generate sufficient amplitude of oscillation across the crystal, which can be converted into a clock signal (e.g., on XOP node 224). The rms drive output current is defined by the DC current clamp value placed in the AB output amplifier stage 300.

Figure 4A:
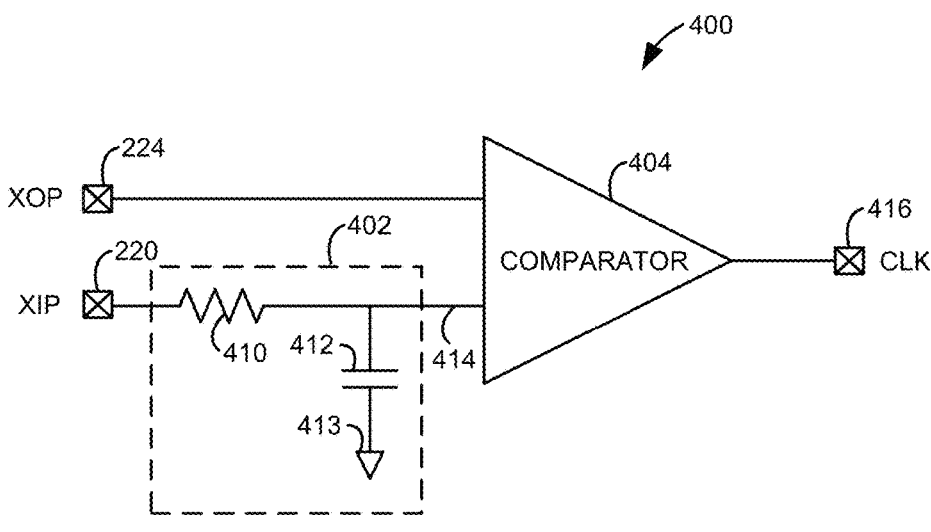
FIG. 4A is a schematic diagram illustrating an exemplary clock signal generation circuit.

FIG. 4A is a schematic diagram illustrating an exemplary clock signal generation circuit 400. In some examples, clock signal generation circuit 400 may be combined with crystal oscillator 200 of FIG. 2 to generate a clock signal. Clock signal generation circuit 400 includes a phase corrector 402 and a comparator 404. Phase corrector 402 includes a resistor-capacitor (RC) network including a resistor 410 and a capacitor 412. XOP node 224 is electrically connected to a first input of comparator 404. XIP node 220 is electrically connected to the input of phase corrector 402 including a first side of resistor 410. The output of phase corrector 402 and the other side of resistor 410 and one side of capacitor 412 are electrically connected to a second input of comparator 404 through a signal path 414. The other side of capacitor 412 is electrically connected to a common or ground node 413. The output of comparator 404 is electrically connected to a clock signal node 416.

Accordingly, the phase corrector 402 includes an input (XIP node 220) that may be electrically connected to the input of the two stage amplifier (e.g., input of transconductance amplifier 202 of FIG. 2). Comparator 404 includes a first input electrically connected to the output (XOP node 224) of the two stage amplifier (e.g., output of AB output amplifier stage 204 of FIG. 2 or 300 of FIG. 3A), a second input electrically connected to an output (414) of the phase corrector, and an output (CLK node 416) to provide a clock signal based on the first input and the second input.

In some examples, comparator 404 might be a resolver, which generates the clock signal by resolving the difference between the signals on XIP node 220 and XOP node 224. Since the signal on XIP node 220 and the signal on XOP node 224 are not exactly 180 degree phase shifted due to current starving (e.g., due to current clamping within AB output amplifier stage 300 of FIG. 3A), an additional phase shift with little attenuation may be provided by phase corrector 402. Phase corrector 402 may include an nth order phase correction filter (e.g., provided by resistor 410 and capacitor 412) with a cutoff frequency selected to generate considerable phase shift without significantly attenuating the voltage of the signal at the input 414 of comparator 404. In some examples, the cutoff frequency may be selected to be slightly higher than the oscillation frequency.

Figure 4B:
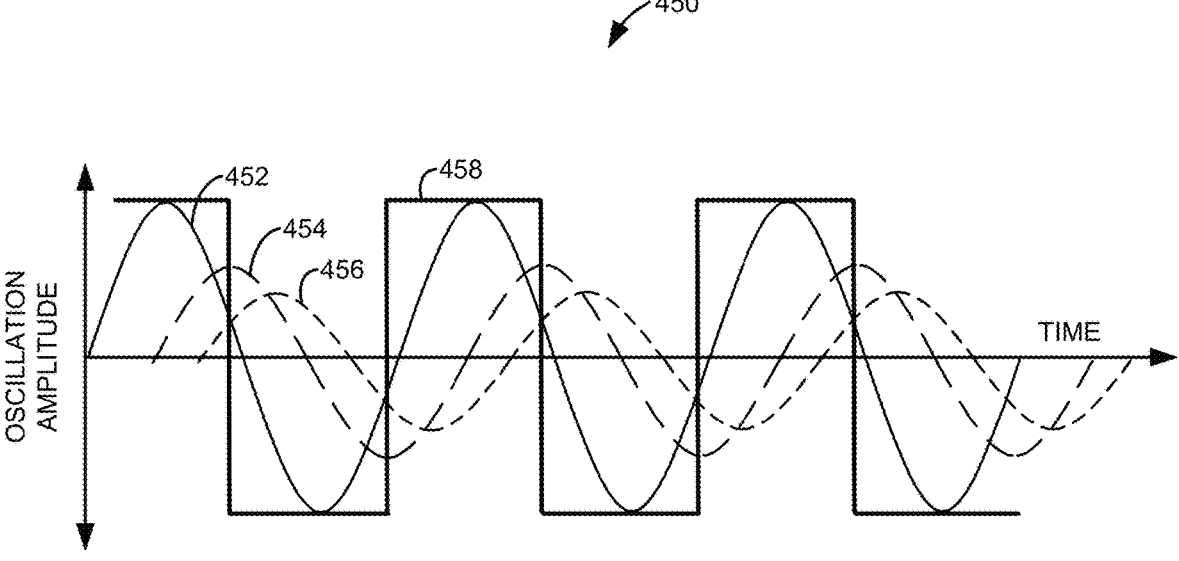
FIG. 4B is a signal diagram illustrating exemplary signals for the clock signal generation circuit of FIG. 4A.

FIG. 4B is a signal diagram 450 illustrating exemplary signals for the clock signal generation circuit 400 of FIG. 4A. Signal diagram 450 includes time on the x-axis and oscillation amplitude on the y-axis. Signal 452 represents the XOP signal on XOP node 224 of FIG. 4A. Signal 454 represents the XIP signal on XIP node 220 of FIG. 4A. Signal 456 represents the phase shifted XIP signal on node 414 of FIG. 4A. Signal 458 represents the clock signal on CLK node 416 of FIG. 4A. As shown in FIG. 4B, phase corrector 402 phase shifts the XIP signal 454 to generate the phase shifted XIP signal 456 with little attenuation of the signal. Comparator 404 compares the XOP signal 452 to the phase shifted XIP signal 456 to generate the clock signal 458. In response to the XOP signal 452 being greater than the phase shifted XIP signal 456, comparator 404 outputs a logic high value (e.g., 1 or reference voltage). In response to the XOP signal 452 being less than the phase shifted XIP signal 456, comparator 404 outputs a logic low value (e.g., 0 or common or ground voltage). Accordingly, clock generation circuit generates a square wave clock signal 458 based on the sine wave signals XOP 452 and XIP 454.

Figure 5:
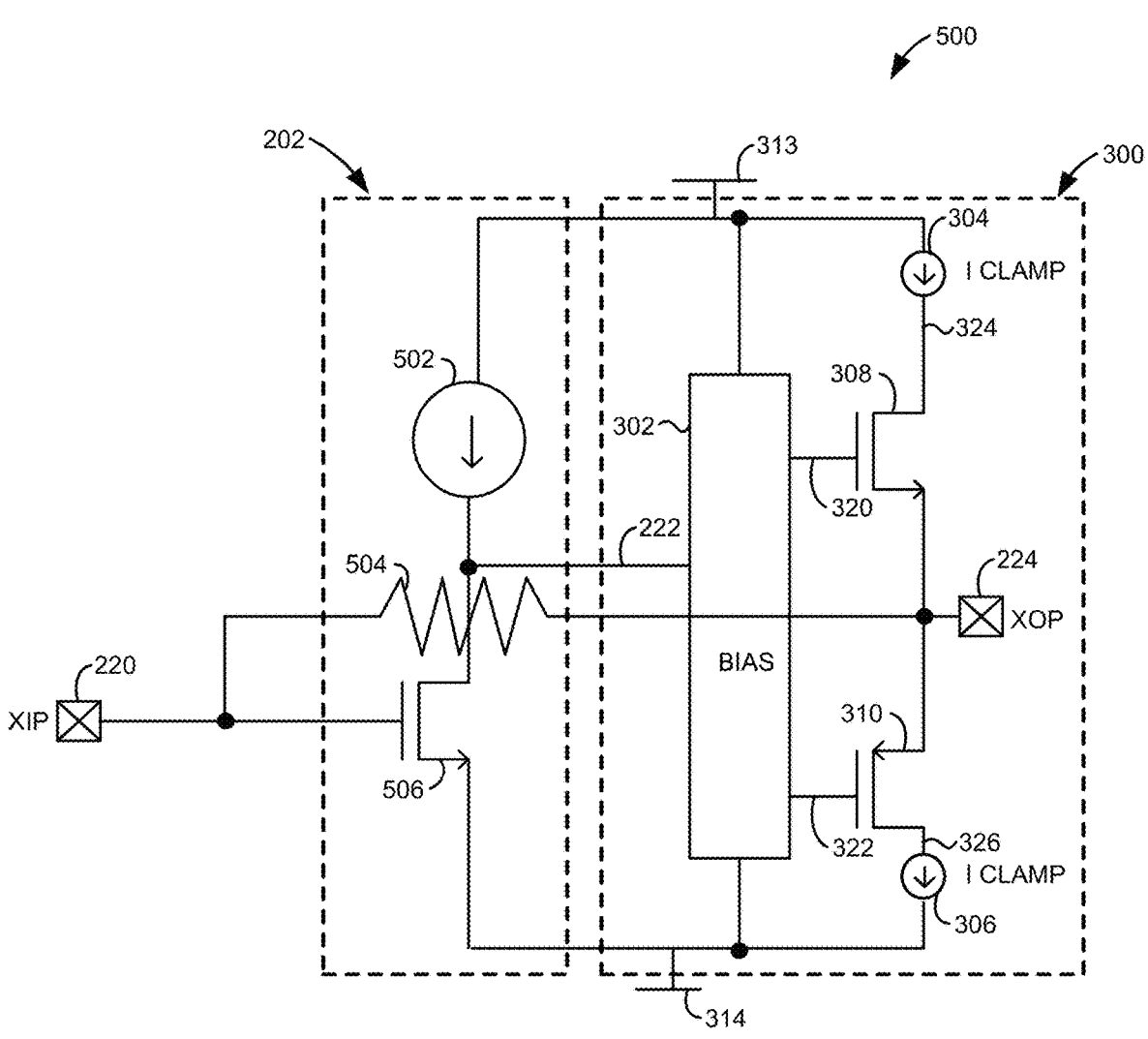
FIG. 5 is a schematic diagram illustrating an exemplary crystal oscillator.

FIG. 5 is a schematic diagram illustrating an exemplary crystal oscillator 500. Crystal oscillator 500 includes a resistor 504; a transconductance amplifier stage 202 including a current source 502 and a transistor 506 (e.g., field-effect transistor); and an AB output amplifier stage 300 as previously described and illustrated with reference to FIG. 3A. XIP node 220 is electrically connected to one side of resistor 504 and the gate of transistor 506. The other side of resistor 504 is electrically connected to XOP node 224. Power supply 313 is electrically connected to one side of current source 502. The other side of current source 502 is electrically connected to an input of bias circuit 302 and one side of the source-drain path (e.g., drain) of transistor 506 through signal path 222. The other side of the source-drain path (e.g., source) of transistor 506 is electrically connected to common or ground node 314.

Current source 502 and transistor 506 form a transconductance amplifier (e.g., 202 of FIG. 2) to amplify the signal on XIP node 220 to provide the signal on signal path 222 input to bias circuit 302. The transconductance amplifier 202 also provides a negative resistance as previously described. AB output amplifier stage 300 buffers the signal on signal path 222 to provide the signal on XOP node 224, which is current limited by the peak current (I CLAMP) of each current source 304 and 306 as previously described. Resistor 504 controls the feedback between the XOP node 224 and the XIP node 220 to ensure stable operation and prevent distortion or instability in crystal oscillator 500.

While AB output amplifier stage 300 in FIG. 5 is a source-follower amplifier stage, in some examples, the AB output amplifier stage may be another amplifier output stage including a low output impedance. The two stage amplifier of crystal oscillator 500 might provide a greater negative resistance to operating current ratio compared to a crystal oscillator including a single stage amplifier. The two stage amplifier of crystal oscillator 500 might provide improved drive capability with a lower operating current compared to a crystal oscillator including a single stage amplifier. In addition, crystal oscillator 500 does not use an amplifier gain controller (AGC) feedback loop as might be used in a crystal oscillator including a single stage amplifier, thereby reducing power consumption of crystal oscillator 500 compared to a crystal oscillator including an amplifier gain controller. Accordingly, the power consumption of crystal oscillator 500 including a two stage amplifier might be about one third the power consumption of a crystal oscillator including a single stage amplifier.

This power consumption reduction might be obtained without any performance loss.

Figure 6A:
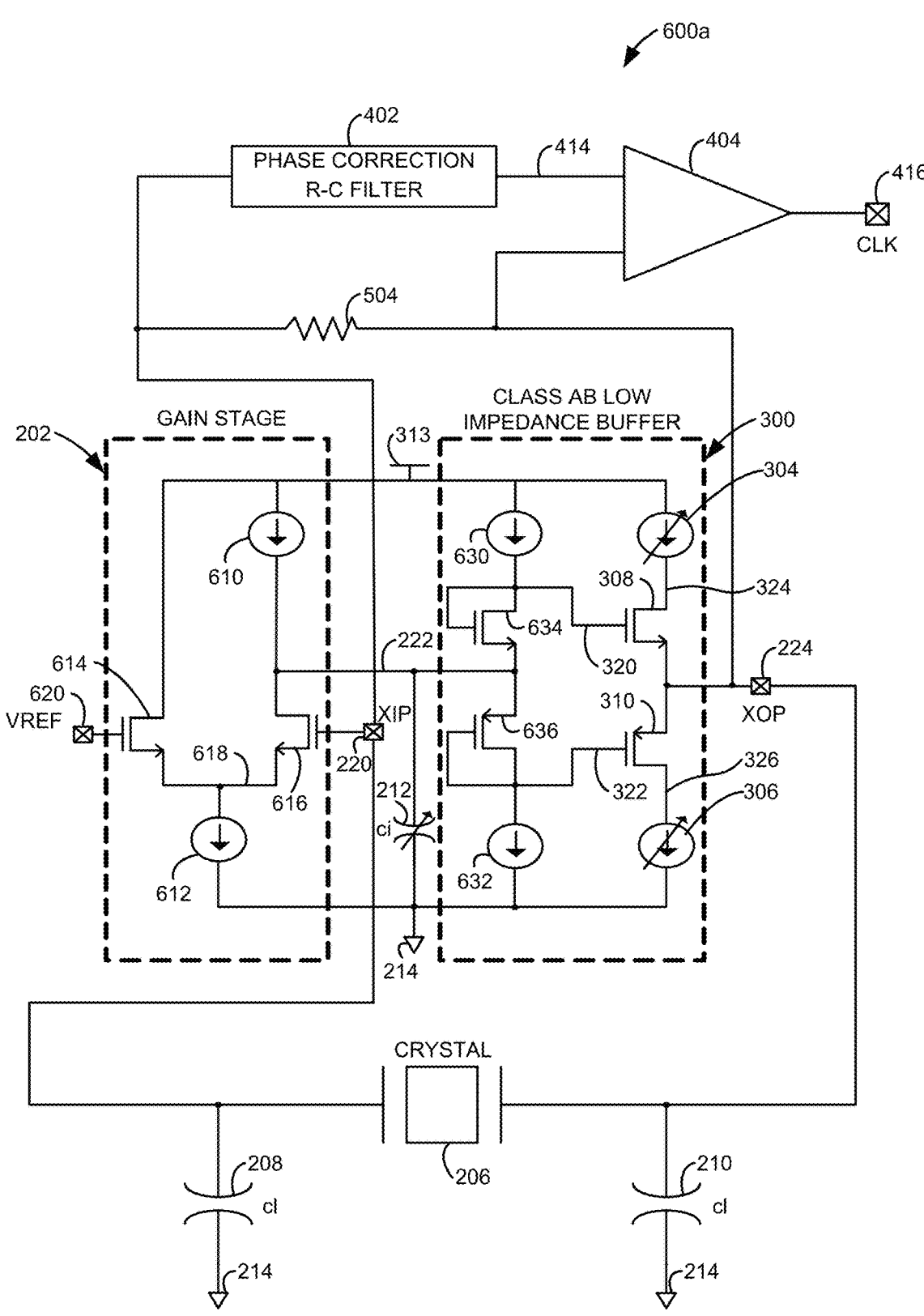
FIGS. 6A and 6B are schematic diagrams illustrating other exemplary crystal oscillators.

FIG. 6A is a schematic diagram illustrating another exemplary crystal oscillator 600a. Crstal oscillator 600a includes a crystal 206, capacitors 208, 210, and 212, a first amplifier stage 202 (e.g., a gain stage), a second amplifier stage 300 (e.g., a class AB low impedance buffer output amplifier stage), a resistor 504, a phase correction R-C filter 402, and a comparator 404. In this example, first amplifier stage 202 might include current sources 610 and 612 and transistors 614 and 616 (e.g., field-effect transistors). Second amplifier stage 300 includes current sources 304, 306, 630, and 632, and transistors 308, 310, 634, and 636 (e.g., field-effect transistors). In some examples, current sources 630 and 632 and transistors 634 and 636 form bias circuit 302 previously described and illustrated with reference to FIGS. 3A and 5.

One terminal of crystal 206 is electrically connected to one side of capacitor 208 and the gate of transistor 616 through XIP node 220. The other terminal of crystal 206 is electrically connected to one side of capacitor 210 through XOP node 224. Power supply node 313 is electrically connected to one side of the source-drain path (e.g., drain) of transistor 614, one side of current source 610, one side of current source 630, and one side of current source 304. The gate of transistor 614 is electrically connected to a voltage reference (VREF) node 620. The other side of the source-drain path (e.g., source) of transistor 614 is electrically connected to one side of the current source 612 and one side of the source-drain path (e.g., source) of transistor 616 through a signal path 618. The other side of current source 610 is electrically connected to the other side of the source-drain path (e.g., drain) of transistor 616, one side of capacitor 212, one side of the source-drain path (e.g., source) of transistor 634, and one side of the source-drain path (e.g., drain) of transistor 636 through signal path 222. The gate of transistor 616 is electrically connected to one side of resistor 504 and the input of phase correction R-C filter 402 through XIP node 220.

The other side of current source 630 is electrically connected to the gate and the other side of the source-drain path (e.g., drain) of transistor 634 and the gate of transistor 308 through signal path 320. The gate and the other side of the source-drain path (e.g., source) of transistor 636 is electrically connected to one side of current source 632 and the gate of transistor 310 through signal path 322. The other side of current source 304 is electrically connected to one side of the source-drain path (e.g., drain) of transistor 308. The other side of the source-drain path (e.g., source) of transistor 308 is electrically connected to one side of the source-drain path (e.g., drain) of transistor 310, the other side of resistor 504, and an input of comparator 404 through XOP node 224. The other side of capacitor 208, capacitor 210, capacitor 212, current source 612, current source 632, and current source 306 are electrically connected to common or ground node 214. The output of phase correction R-C filter 402 is electrically connected to an input of comparator 404 through signal path 414. The output of comparator 404 is electrically connected to CLK node 416.

In some examples, current source 612 might include a first bias current ($I_{BIAS1}$) and each current source 630 and 632 might include a second bias current ($I_{BIAS2}$). Current source 610 might include one half of the first bias current ($I_{BIAS1}/2$). Transconductance amplifier gain stage 202 generates an output signal on signal path 222 (which is input to class AB low impedance buffer 300) based on the signal on XIP node 220. Gain stage 202 also provides a negative resistance as previously described. Class AB low impedance buffer 300 generates an output signal on XOP node 224 based on the input signal on signal path 222 as previously described. Resistor 504 controls the feedback between the XOP node 224 and the XIP node 220 to ensure the amplifier is biased in a high gain region (e.g., around the potential of VREF) to generate sufficient negative resistance for stable oscillation in crystal oscillator 600a. Phase correction R-C filter 402 and comparator 404 form a clock generation circuit (e.g., 400 of FIG. 4A) as previously described to generate a clock signal on CLK node 416 based on the signal on XIP node 220 and the signal on XOP node 224. Crystal oscillator 600a includes the same advantages (e.g., lower power consumption) as crystal oscillator 200 of FIG. 2 and 500 of FIG. 5.

Figure 6B:
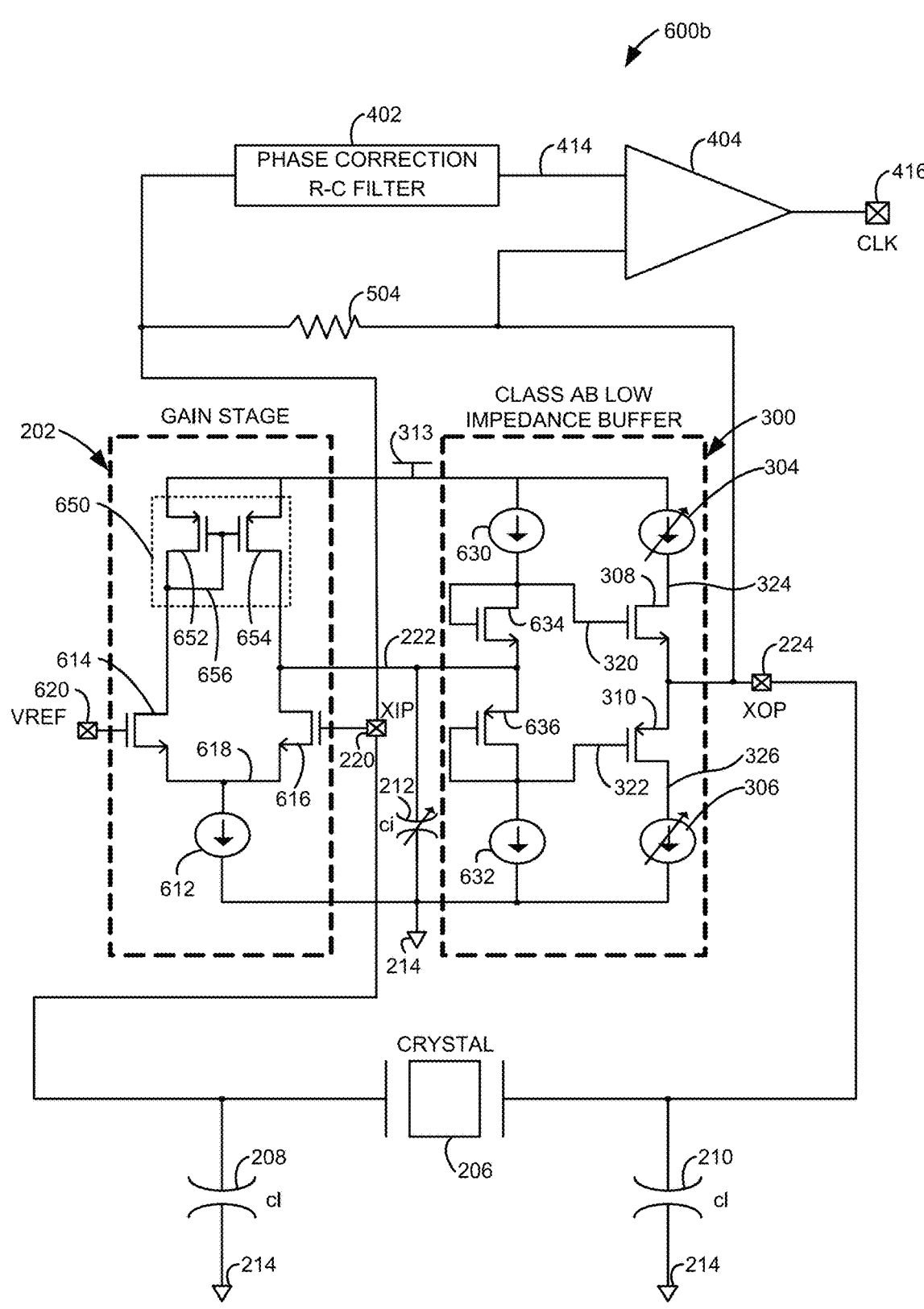

FIG. 6B is a schematic diagram illustrating another exemplary crystal oscillator 600b. Crystal oscillator 600b is similar to crystal oscillator 600a previously described and illustrated with reference to FIG. 6A, except that in crystal oscillator 600b, current source 610 is replaced with a current mirror 650. Current mirror 650 includes transistors 652 and 654 (e.g., field-effect transistors). Power supply node 313 is electrically connected to one side of the source-drain path (e.g., drain) of transistor 652 and one side of the source-drain path (e.g., drain) of transistor 654. The gate of transistor 652 is electrically connected to the other side of the source-drain path (e.g., source) of transistor 652, the gate of transistor 654, and one side of the source-drain path (e.g., drain of transistor 614) through a signal path 656. The other side of the source-drain path (e.g., source) of transistor 654 is electrically connected to one side of the source-drain path (e.g., drain) of transistor 616, one side of capacitor 212, one side of the source-drain path (e.g., source) of transistor 634, and one side of the source-drain path (e.g., drain) of transistor 636 through signal path 222. By using current mirror 650 in first amplifier stage 202, the gain of first amplifier stage 202 may be maximized.

Figure 7A:
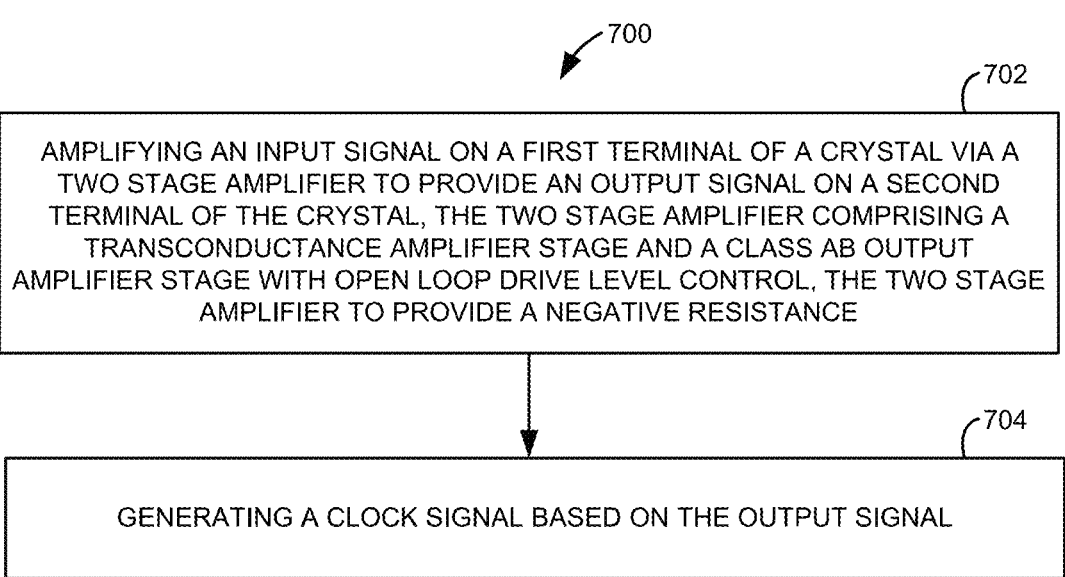
FIGS. 7A and 7B are flow diagrams illustrating an exemplary method for generating a clock signal.
Figure 7B:
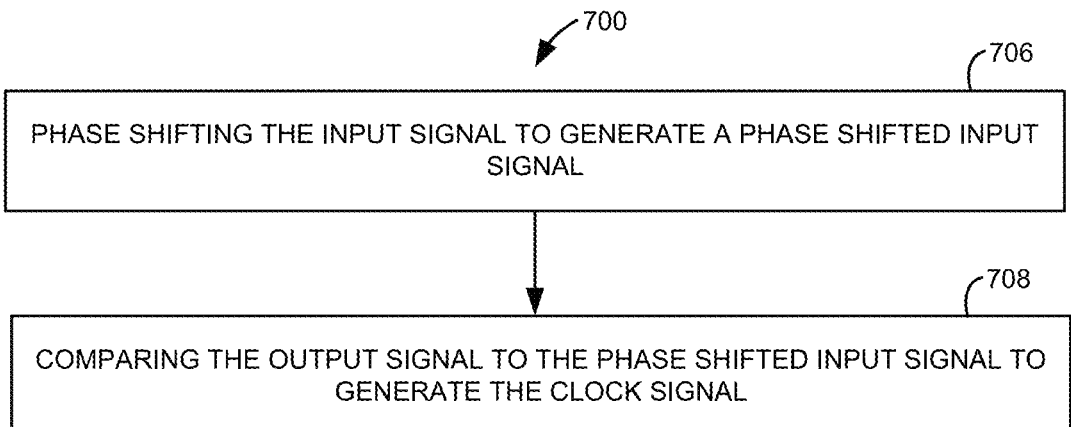

FIGS. 7A and 7B are flow diagrams illustrating an exemplary method 700 for generating a clock signal, such as clock signal 458 of FIG. 4B on CLK node 416 of FIG. 4A or 6. As illustrated in FIG. 7A at 702, method 700 includes amplifying an input signal (e.g., 454 of FIG. 4B) on a first terminal (e.g., XIP node 220) of a crystal (e.g., 206) via a two stage amplifier (e.g., of crystal oscillator 200 of FIG. 2, 500 of FIG. 5, 600a of FIG. 6A, or 600b of FIG. 6B) to provide an output signal (e.g., 452 of FIG. 4B) on a second terminal (e.g., XOP node 224) of the crystal, the two stage amplifier comprising a transconductance amplifier stage (e.g., 202 FIG. 2, 5, or 6) and a class AB output amplifier stage (e.g., 204 of FIG. 2 or 300 of FIG. 3A, 5, or 6) with open loop drive level control, the two stage amplifier to provide a negative resistance. At 704 method 700 includes generating a clock signal (e.g., 458 of FIG. 4B) based on the output signal.

As illustrated in FIG. 7B at 706, method 700 may further include phase shifting (e.g., via 402 of FIG. 4A or 6) the input signal (e.g., 454 of FIG. 4B) to generate a phase shifted input signal (e.g., 456 of FIG. 4B). At 708, method 700 may further include comparing (e.g., via comparator 404 of FIG. 4A or 6) the output signal (e.g., 452 of FIG. 4B) to the phase shifted input signal to generate the clock signal. In some examples, phase shifting the input signal includes filtering the input signal (e.g., via R-C network 410 and 412 of FIG. 4A) to generate the phase shifted input signal.

Figure 8:
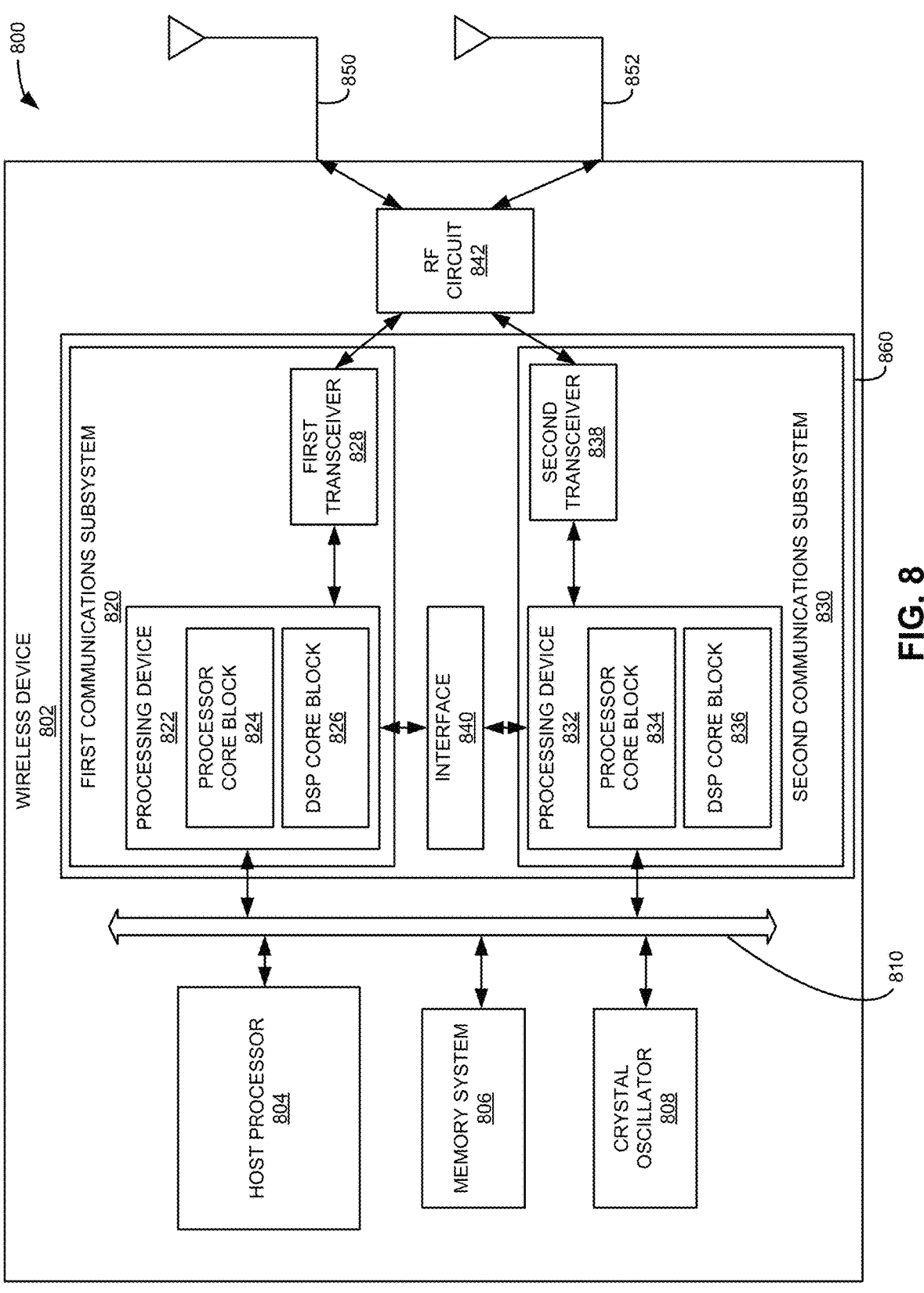
FIG. 8 is a block diagram illustrating an exemplary wireless device including a crystal oscillator.

FIG. 8 is a block diagram illustrating an exemplary system 800 including a wireless device 802, an antenna 850, and an antenna 852. Wireless device 802 includes a host processor 804, a memory system 806, a crystal oscillator 808, a bus 810, a first communications subsystem 820, a second communications subsystem 830, an interface 840, and an RF circuit 842. First communications subsystem 820 includes a processing device 822 and a first transceiver 828. Processing device 822 may include a processor core block 824 and a digital signal processing (DSP) core block 826. Second communications subsystem 830 includes a processing device 832 and a second transceiver 838. Processing device 832 may include a processor core block 834 and a DSP core block 836.

Host processor 804, memory system 806, and crystal oscillator 808 are each communicatively coupled to the first communications subsystem 820 and the second communications subsystem 830 via bus 810. Processing device 822 of first communications subsystem 820 is communicatively coupled to first transceiver 828. First transceiver 828 is communicatively coupled to RF circuit 842. Processing device 832 of second communications subsystem 830 is communicatively coupled to second transceiver 838. Second transceiver 838 is communicatively coupled to RF circuit 842. Processing device 822 of first communications subsystem 820 is communicatively coupled to processing device 832 of second communications subsystem 830 via interface 840. RF circuit 842 is electrically connected to antenna 850 and antenna 852.

In some examples, crystal oscillator 808 may include a two stage amplifier including a transconductance amplifier stage electrically connected to a class AB output amplifier stage with open loop drive level control, such as crystal oscillator 200 of FIG. 2, 500 of FIG. 5, 600a of FIG. 6A, or 600b of FIG. 6B. Accordingly, as previously described with reference to FIGS. 1-7B, the power consumption of wireless device 802 may be less than the power consumption of a wireless device including a crystal oscillator including a single stage amplifier.

Wireless device 802 may communicate with other devices via a Wi-Fi connection and/or a Bluetooth connection. Wireless device 802 may be compatible with one or more wireless transmission protocols, such as a Wi-Fi protocol or a Bluetooth protocol. In some examples, wireless device 802 may be a smart device, such as those found in wearable devices (e.g., watch, fitness band, fitness ring), or may be a monitoring device, such as those found in smart buildings, environmental monitoring, and energy management. It will be appreciated that such wireless devices disclosed herein may be any suitable device, such as those found in cars, other vehicles, and even medical implants.

In some examples, wireless device 802 includes collocated transceivers, such as first transceiver 828 and second transceiver 838. First transceiver 828 and second transceiver 838 are configured to transmit and receive signals using a communications medium that may include antenna 850 or antenna 852. In some examples, first transceiver 828 may be a Wi-Fi transceiver. Accordingly, first transceiver 828 may be compatible with a Wi-Fi communications protocol, such as an 802.11ax protocol. Second transceiver 838 may be a Bluetooth transceiver. For example, second transceiver 838 may be compatible with a Bluetooth Low Energy communications protocol. In some examples, transceivers 828 and 838 each include a modulator and demodulator as well as one or more buffers and filters that are configured to generate and receive signals via antenna 850 and/or antenna 852.

In some examples, communications subsystems 820 and 830 may include processing devices and transceivers that are used to implement radios. In some examples, processing devices, such as processing device 822, may include logic implemented using one or more processor cores. Accordingly, processing device 822 is configured to implement logic for wireless activity. In some examples, processing device 822 includes processing elements configured to perform timing value computation and transmission operations, as well as scheduling operations. Processing device 822 includes one or more components configured to implement a medium access control (MAC) layer that is configured to control hardware associated with a wireless transmission medium, such as that associated with a Wi-Fi transmission medium. Processor core block 824 may be configured to implement a driver, such as a Wi-Fi driver. Accordingly, processing device 822 may include components associated with first transceiver 828, such as MAC layers and packet traffic arbiters. Digital signal processor (DSP) core block 826 may be configured to include microcode.

Processing device 832 of second communications subsystem 830 may also be configured to implement logic for wireless activity. Accordingly, processing device 832 may include processing elements configured to perform timing value computation and transmission operations. Processor core block 834 may include multiple processor cores that are each configured to implement specific portions of a wireless protocol interface. For example, a Bluetooth protocol may be implemented using a Bluetooth stack in which software is implemented as a stack of layers, and such layers are configured to compartmentalize specific functions utilized to implement the Bluetooth communications protocol. In some examples, a host stack includes layers for a Bluetooth network encapsulation protocol, radio frequency communication, service discovery protocol, as well as various other high-level data layers. In addition, a controller stack may include a link management protocol, a host controller interface, a link layer that may be a low energy link layer, as well as various other timing critical layers. Digital signal processor (DSP) core block 836 may be configured to include microcode.

Interface 840 is configured to provide communication between processing device 822 and processing device 832. Accordingly, components of the processing devices, such as packet traffic arbiters and schedulers, may communicate with each other via interface 840. Interface 840 may be a coexistence interface, such as a serial enhanced coexistence interface (SECI). It will be appreciated that interface 840 may be other types of interfaces as well, such as a 3-wire interface or a 4-wire interface. Accordingly, interface 840 enables the passage of coexistence data and timing information between collocated devices.

In some examples, RF circuit 842 may include various components such as an RF switch, a diplexer, and a filter. Accordingly, RF circuit 842 may be configured to select an antenna for transmission/reception, and may be configured to provide coupling between the selected antenna, such as antenna 850 or antenna 852, and other components of system 800 via a bus, such as bus 810. While one RF circuit is shown in FIG. 8, it will be appreciated that wireless device 802 may include multiple RF circuits. Accordingly, each of multiple antennas may have its own RF circuit. In addition, each RF circuit may be associated with a particular wireless communications protocol, such as a first antenna and RF circuit for Wi-Fi and a second antenna and RF circuit for Bluetooth. While FIG. 8 illustrates system 800 as having multiple antennas, it will be appreciated that system 800 may be implemented with a single antenna.

Memory system 806 may be configured to store one or more data values associated with wireless activity. Accordingly, memory system 806 may include a storage device, which may be a non-volatile random-access memory (NVRAM) configured to store such data values, and may also include a cache that is configured to provide a local cache. Host processor 804 may be configured to implement processing operations implemented by system 800.

It will be appreciated that one or more of the above-described components may be implemented on a single chip, or on different chips. For example, first transceiver 828, second transceiver 838, processing device 822, and processing device 832 may be implemented on the same integrated circuit chip, such as integrated circuit chip 860. In another example, first transceiver 828, second transceiver 838, processing device 822, and processing device 832 may each be implemented on their own chip, and thus may be disposed separately as a multi-chip module or on a common substrate such as a printed circuit board (PCB). It will also be appreciated that components of system 800 may be implemented in the context of a low energy device, a smart device, or a vehicle such as an automobile. Accordingly, some components, such as integrated chip 860, may be implemented in a first location, while other components, such as antenna 850 and/or antenna 852, may be implemented in a second location, and coupling between the two may be implemented via a coupler.

It is to be understood that the features of the various exemplary embodiments described herein may be combined with each other, unless specifically noted otherwise.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

What is claimed is:

1. A crystal oscillator comprising:
a two stage amplifier comprising a transconductance amplifier stage electrically connected to a class AB output amplifier stage with open loop drive level control, the two stage amplifier to provide a negative resistance; and
a crystal electrically connected between an input of the two stage amplifier and an output of the two stage amplifier.

2. The crystal oscillator of claim 1, further comprising:

a phase corrector comprising an input electrically connected to the input of the two stage amplifier; and
a comparator comprising a first input electrically connected to the output of the two stage amplifier, a second input electrically connected to an output of the phase corrector, and an output to provide a clock signal based on the first input and the second input.

3. The crystal oscillator of claim 2, wherein the phase corrector comprises a resistor-capacitor (RC) circuit.

4. The crystal oscillator of claim 1, further comprising:
a resistor electrically connected between the output of the two stage amplifier and the input of the two stage amplifier.

5. The crystal oscillator of claim 1, wherein the class AB output amplifier stage comprises a source-follower amplifier stage.

6. The crystal oscillator of claim 1, wherein the class AB output amplifier stage comprises a voltage gain of 1.

7. The crystal oscillator of claim 1, wherein the class AB output amplifier stage comprises a push-pull class AB output amplifier stage.

8. The crystal oscillator of claim 1, wherein the open loop drive level control comprises current limiting at the class AB output amplifier stage via current clamps.

9. A device comprising:
a crystal oscillator to generate a clock signal, the crystal oscillator comprising:
a two stage amplifier comprising a transconductance amplifier stage electrically connected to a class AB output amplifier stage with open loop drive level control, the two stage amplifier to provide a negative resistance; and
a crystal electrically connected between an input of the two stage amplifier and an output of the two stage amplifier; and
a circuit electrically connected to the crystal oscillator and configured to operate based on the clock signal.

10. The device of claim 9, wherein the crystal oscillator further comprises:
a phase corrector comprising an input electrically connected to the input of the two stage amplifier; and
a comparator comprising a first input electrically connected to the output of the two stage amplifier, a second input electrically connected to an output of the phase corrector, and an output to provide the clock signal based on the first input and the second input.

11. The device of claim 9, wherein the class AB output amplifier stage comprises a push-pull class AB output amplifier stage.

12. The device of claim 9, wherein the class AB output amplifier stage comprises a voltage gain less than or equal to 1.

13. The device of claim 9, wherein the class AB output amplifier stage comprises a source-follower amplifier stage.

14. The device of claim 9, wherein the open loop drive level control comprises current limiting at the class AB output amplifier stage.

15. The device of claim 9, wherein the circuit comprises a microcontroller.

16. The device of claim 9, wherein the device comprises a wireless device.

17. The device of claim 9, wherein the device comprises a comprises a watch.

18. A method for generating a clock signal, the method comprising:
amplifying an input signal on a first terminal of a crystal via a two stage amplifier to provide an output signal on a second terminal of the crystal, the two stage amplifier comprising a transconductance amplifier stage and a class AB output amplifier stage with open loop drive level control, the two stage amplifier to provide a negative resistance; and generating a clock signal based on the output signal.

19. The method of claim 18, wherein generating the clock signal based on the output signal comprises:

phase shifting the input signal to generate a phase shifted input signal; and comparing the output signal to the phase shifted input signal to generate the clock signal.

20. The method of claim 19, wherein phase shifting the input signal comprises filtering the input signal to generate the phase shifted input signal.

\* \* \* \* \*